US011457146B1

(12) United States Patent
Ng

(10) Patent No.: US 11,457,146 B1
(45) Date of Patent: Sep. 27, 2022

(54) SYNCHRONIZING A MULTI-CAMERA SYSTEM

(71) Applicant: Amazon Technologies, Inc., Seattle, WA (US)

(72) Inventor: Poh-Keong Ng, Medford, MA (US)

(73) Assignee: Amazon Technologies, Inc., Seattle, WA (US)

( * ) Notice: Subject to any disclaimer, the term of this patent is extended or adjusted under 35 U.S.C. 154(b) by 420 days.

(21) Appl. No.: 16/751,001

(22) Filed: Jan. 23, 2020

(51) Int. Cl.
*H04N 5/232* (2006.01)
*G01R 19/165* (2006.01)
*H04N 13/296* (2018.01)

(52) U.S. Cl.
CPC ..... *H04N 5/23241* (2013.01); *G01R 19/1658* (2013.01); *G01R 19/16547* (2013.01); *H04N 13/296* (2018.05)

(58) Field of Classification Search
CPC ............. H04N 5/23241; H04N 13/296; G01R 19/16547; G01R 19/1658
See application file for complete search history.

(56) References Cited

U.S. PATENT DOCUMENTS

| 9,117,106 | B2 | 8/2015 | Dedeoglu et al. |
| 9,235,928 | B2 | 1/2016 | Medioni et al. |
| 9,473,747 | B2 | 10/2016 | Kobres et al. |
| 10,368,057 | B1 * | 7/2019 | Saran ..................... H04N 5/247 |
| 2013/0284806 | A1 | 10/2013 | Margalit |

* cited by examiner

*Primary Examiner* — Twyler L Haskins
*Assistant Examiner* — Fayez A Bhuiyan
(74) *Attorney, Agent, or Firm* — Lee & Hayes, P.C.

(57) ABSTRACT

Techniques for synchronizing acquisition of image data by cameras in a multi-camera system using a waveform associated with an AC power supply for the cameras. Each camera in the multi-camera system may receive power from the AC power supply provided using an AC voltage signal. Further, each camera may be configured to identify predefined voltages on a waveform of the AC voltage signal. By detecting the predefined voltage on the waveform of the AC voltage signal, the cameras may be synchronized according to a frequency of the AC voltage signal. The cameras may be configured to synchronize acquisition of image data from respective imaging sensors based on the frequency of the AC voltage signal. In this way, the cameras of the multi-camera system may be synchronized using an AC power signal delivered through wires that are used to deliver power to the multiple cameras.

20 Claims, 10 Drawing Sheets

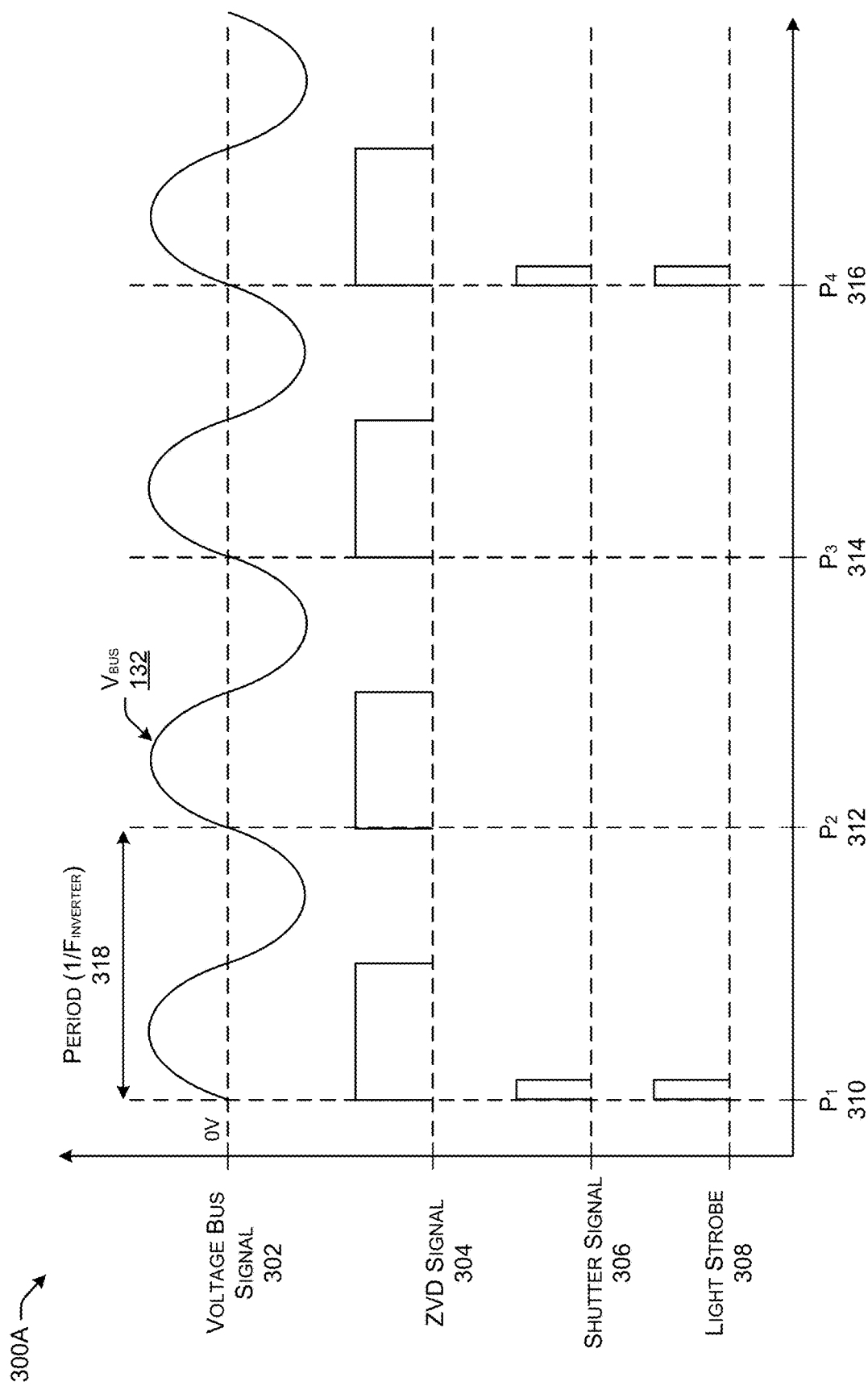

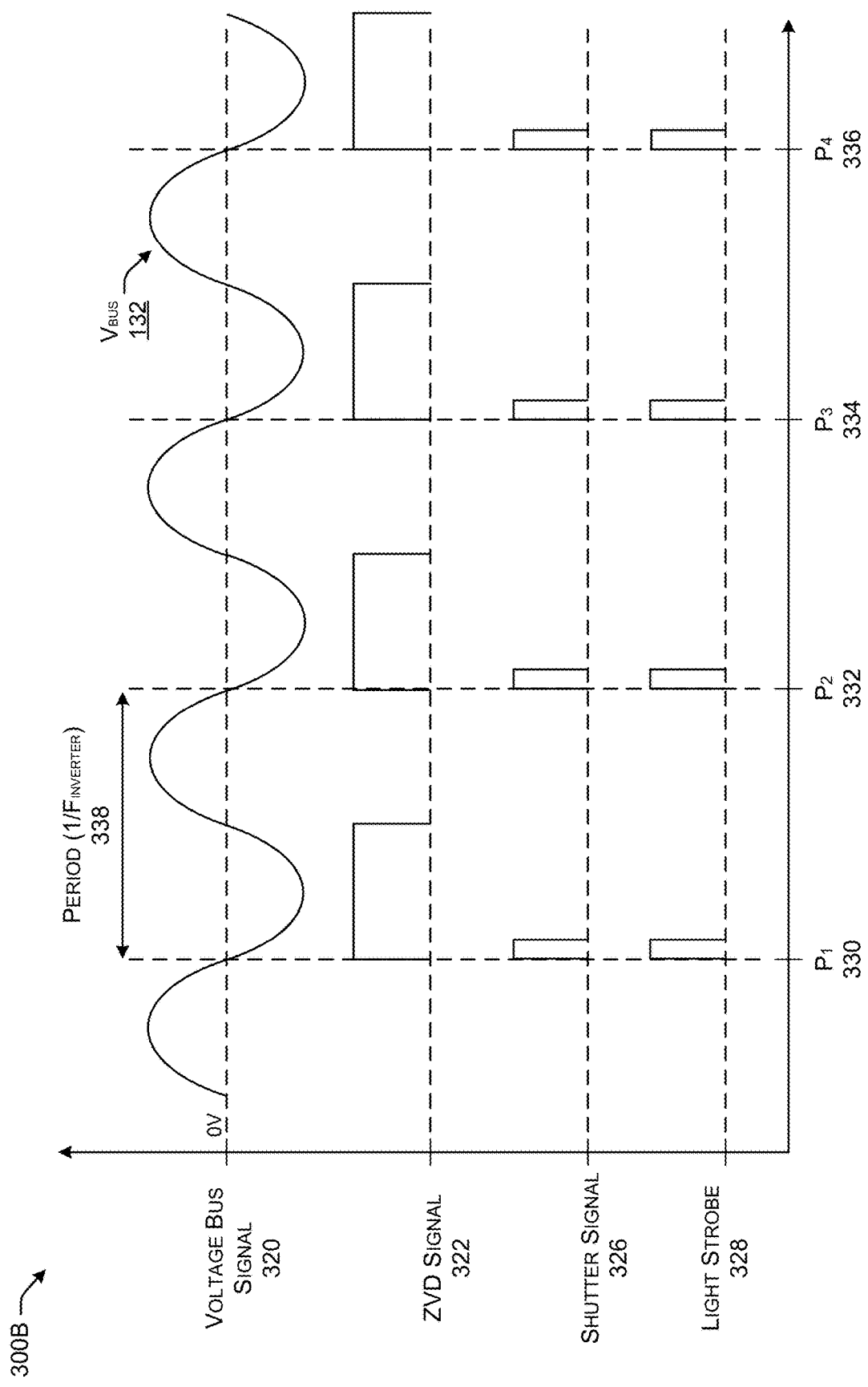

400

```
┌─────────────────────────────────────────────┐
│ SUPPLY ALTERNATING CURRENT (AC) POWER VIA AN AC │
│ VOLTAGE SIGNAL TO A FIRST CAMERA MODULE AND A SECOND │
│           CAMERA MODULE                     │
│                  402                        │
└─────────────────────────────────────────────┘
                      │
                      ▼
┌─────────────────────────────────────────────┐
│ IDENTIFY, AT THE FIRST CAMERA MODULE A PREDEFINED │
│ VOLTAGE ON A WAVEFORM OF THE AC VOLTAGE SIGNAL │
│                  404                        │
└─────────────────────────────────────────────┘
                      │
                      ▼
┌─────────────────────────────────────────────┐
│ CAUSE A FIRST READOUT OF A FIRST PORTION OF FIRST │
│ IMAGE DATA FROM A FIRST IMAGING SENSOR OF THE FIRST │
│              CAMERA MODULE                  │
│                  406                        │
└─────────────────────────────────────────────┘
                      │
                      ▼
┌─────────────────────────────────────────────┐
│ STORE THE FIRST PORTION OF THE FIRST IMAGE DATA AT THE │
│            FIRST CAMERA MODULE              │
│                  408                        │
└─────────────────────────────────────────────┘
                      │
                      ▼
                    ( 4B )
```

```
┌─────────────────────────────────────────────────────────────┐
│ MONITOR, BY A FIRST DEVICE, A WAVEFORM ASSOCIATED WITH AN    │
│ ALTERNATING CURRENT (AC) VOLTAGE SIGNAL PROVIDED BY A POWER  │
│ SUPPLY THAT SUPPLIES POWER TO THE FIRST DEVICE               │
│ 602                                                          │
└─────────────────────────────────────────────────────────────┘
                              │
                              ▼
┌─────────────────────────────────────────────────────────────┐
│ DETERMINE, AT THE FIRST DEVICE, FIRST FREQUENCY DATA         │
│ INDICATIVE OF A FREQUENCY OF THE WAVEFORM ASSOCIATED WITH    │
│ THE AC VOLTAGE SIGNAL                                        │
│ 604                                                          │
└─────────────────────────────────────────────────────────────┘
                              │
                              ▼
┌─────────────────────────────────────────────────────────────┐
│ BASED AT LEAST IN PART ON THE FREQUENCY OF THE WAVEFORM,     │
│ OBTAIN FIRST IMAGE DATA FROM THE FIRST IMAGING SENSOR, THE   │
│ FIRST IMAGE DATA BEING GENERATED BY THE FIRST IMAGING SENSOR │
│ AT LEAST AT A PARTICULAR TIME                                │
│ 606                                                          │
└─────────────────────────────────────────────────────────────┘
                              │
                              ▼
┌─────────────────────────────────────────────────────────────┐
│ MONITOR, AT A SECOND DEVICE, THE WAVEFORM ASSOCIATED WITH    │
│ THE AC VOLTAGE SIGNAL PROVIDED BY THE POWER SUPPLY THAT      │
│ SUPPLIES POWER TO THE SECOND DEVICE                          │
│ 608                                                          │
└─────────────────────────────────────────────────────────────┘
                              │
                              ▼
┌─────────────────────────────────────────────────────────────┐
│ DETERMINE, AT THE SECOND DEVICE, SECOND FREQUENCY DATA       │
│ INDICATIVE OF THE FREQUENCY OF THE WAVEFORM ASSOCIATED WITH  │
│ THE AC VOLTAGE SIGNAL                                        │
│ 610                                                          │
└─────────────────────────────────────────────────────────────┘
                              │
                              ▼
┌─────────────────────────────────────────────────────────────┐
│ BASED AT LEAST IN PART ON THE FREQUENCY OF THE WAVEFORM,     │
│ OBTAIN, AT THE PARTICULAR TIME, SECOND IMAGE DATA FROM THE   │
│ SECOND IMAGING SENSOR, THE SECOND IMAGE DATA BEING GENERATED │
│ BY THE SECOND IMAGING SENSOR AT LEAST AT THE PARTICULAR TIME │
│ 612                                                          │
└─────────────────────────────────────────────────────────────┘
```

FIG. 6

SYNCHRONIZING A MULTI-CAMERA SYSTEM

BACKGROUND

As computing systems and cameras become faster and more powerful, multi-camera vision systems are increasingly being used in diverse industries and for diverse applications. For example, cameras have traditionally been used in manufacturing to monitor objects moving rapidly on a conveyor for defects by capturing images of the objects for a computer to analyze. In such an example, it may be advantageous to use a multi-camera system so that various perspectives of objects could be analyzed, either looking at independent perspectives of the object and/or combining the image data to generate a three-dimensional data set. To enable this type of analysis of image data obtained from multiple cameras, it is critical to synchronize the image acquisition of the multiple cameras.

Various techniques are used to synchronize the acquisition of image data in multi-camera systems. For instance, some multi-camera systems include a main control board that is used to synchronize each of the cameras by communicating synchronization signals to each of the cameras. However, this system requires that each camera be connected to the main control board via respective cables, which increases the cost, weight, design complexity, and production time. Some technologies may contemplate broadcasting the synchronization signals using a wireless communication protocol to each of the cameras. However, this increases the complexity and cost of the cameras in that they must include a transmitter and a power supply to support the transmissions of data made using the transmitting.

BRIEF DESCRIPTION OF THE DRAWINGS

The detailed description is set forth below with reference to the accompanying figures. In the figures, the left-most digit(s) of a reference number identifies the figure in which the reference number first appears. The use of the same reference numbers in different figures indicates similar or identical items. The systems depicted in the accompanying figures are not to scale and components within the figures may be depicted not to scale with each other.

FIG. 3A illustrates a diagram of example waveforms illustrating the synchronization of image acquisition by cameras in a multi-camera system. In the illustrated example, the cameras synchronize their image acquisition based on detecting that the AC voltage signal of a supply voltage has transitioned from a negative phase into a positive phase (e.g., zero-crossing point), but at a different frequency than that of the AC voltage waveform.

FIG. 3B illustrates a diagram of additional example waveforms illustrating the synchronization of image acquisition by cameras in a multi-camera system. In the illustrated example, the cameras synchronize their image acquisition based on detecting that the AC voltage signal of a supply voltage has transitioned from a positive phase into a negative phase (e.g., zero-crossing point), and at a same frequency than that of the AC voltage waveform.

FIGS. 4A and 4B collectively illustrate a flow diagram of an example method for synchronizing readout of imaging sensors of multiple cameras in a multi-camera system.

FIG. 6 illustrates a flow diagram of another example method for synchronizing image data acquisition among two computing devices that are associated with imaging sensors using a frequency of an AC voltage waveform.

DETAILED DESCRIPTION

Figure 1:
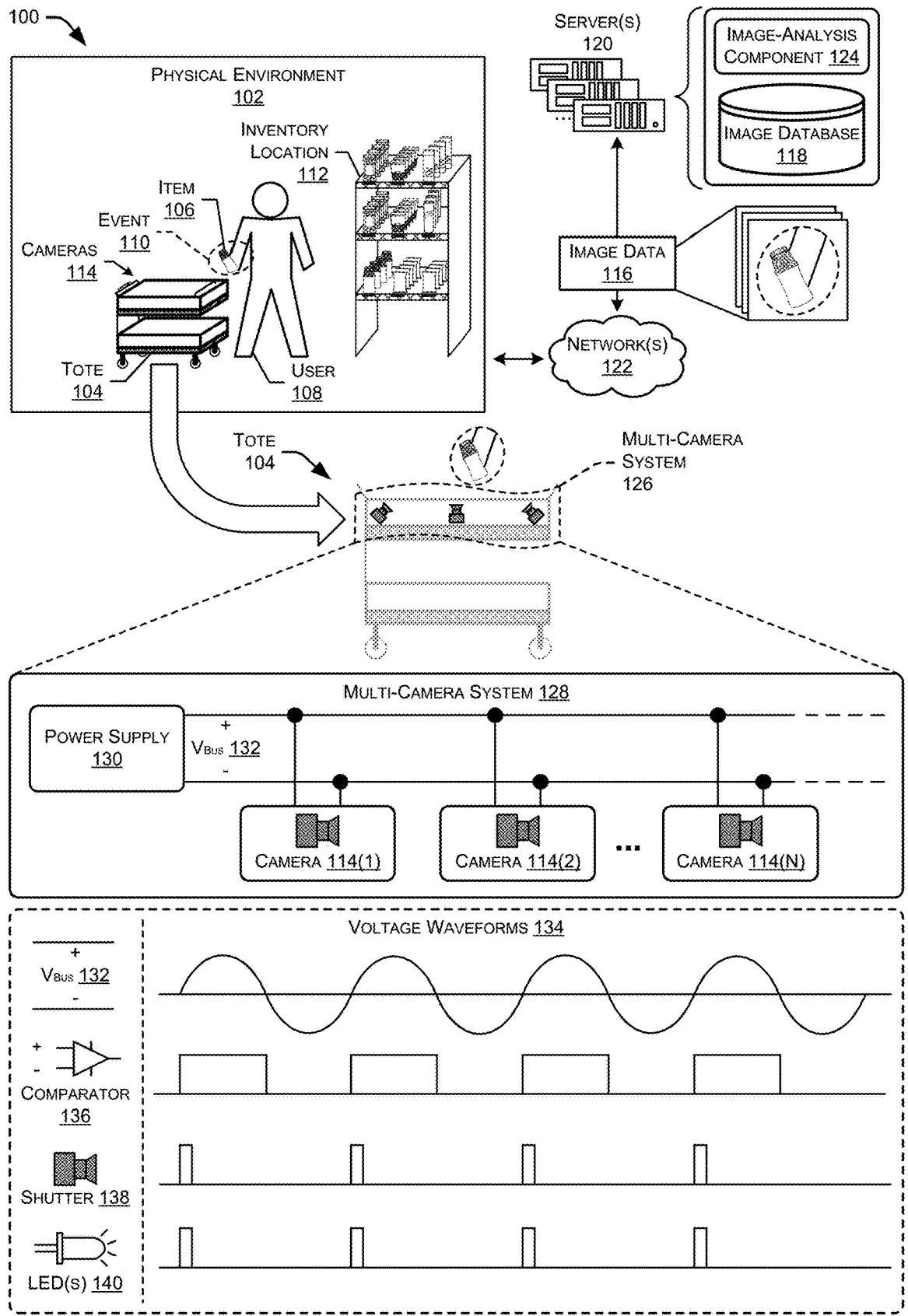
FIG. 1 illustrates a system-architecture diagram of an example environment in which multiple cameras in a multi-camera system synchronize image acquisition based on a frequency of an alternating current (AC) power signal provided to each of the cameras. In the illustrated example, the cameras synchronize based on the frequency of the AC voltage signal.

This disclosure describes techniques for synchronizing image data acquisition of cameras in a multi-camera system using an AC waveform associated with an AC power supply for the cameras, such as an AC voltage waveform. According to the techniques described herein, each camera in a multi-camera system (e.g., at least two cameras) may receive power from a power supply that provides AC power to the cameras. The cameras may each include circuitry, such as a comparator circuit, configured to analyze a waveform of an AC voltage signal to identify predefined voltages on the waveform. For instance, the comparator circuit may output an indication (e.g., logic high signal) to a microcontroller of the camera indicating that the waveform of the AC voltage signal is at a predetermined voltage, such as a zero-crossing of the waveform. The cameras are able to detect predefined voltages during each period of the waveform of the AC voltage signal, thereby synchronizing the cameras according to a frequency of the AV voltage signal. In this way, the cameras may be configured to acquire image data from respective imaging sensors based on a same baseline frequency of the AC voltage signal, thereby synchronizing acquisition of the image data. In this way, the cameras of the multi-camera system may be synchronized together without the requirement of a main control board and additional wires, but instead, be synchronized using an AC power signal through wires that are necessary to deliver power to the multiple cameras.

Although the techniques are generally applicable for any multi-camera system, in some examples, the multi-camera system may be implemented on a tote, cart, basket, bag, and/or other mobile apparatus used to store items. For instance, the multi-camera system may be implemented in a shopping cart that is configured to capture image data that represents items being placed in, and removed from, the shopping cart. Traditionally, a multi-camera system may include a battery power source that provides a DC power signal, and the cameras may be configured with components that are powered by DC power. However, to synchronize the cameras using a power signal, the mobile apparatus may further include a DC/AC inventor that converts the DC power signal supplied from the battery into and AC power signal for use by the cameras. The AC power signal may be supplied to each camera in the multi-camera system to power components of the cameras, and also to provide a master clock to synchronize the image data acquisition performed by each camera.

In some examples, the cameras may each include circuitry to analyze or monitor the AC voltage signal to detect predefined voltages that are used to synchronize the cameras. For instance, each camera may include circuitry and/or a respective microcontroller with instructions to detect a predetermined voltage on a waveform of the AC voltage signal that is provided to each camera. For instance, each camera may include a comparator circuit includes a comparator that is configured to compare, as inputs, a first input signal corresponding to a positive portion of the AC voltage waveform with a second input signal corresponding to a negative portion of the AC voltage waveform. The comparator circuit may compare the input signals and output an indication (e.g., logic high signal) to the microprocessor of when the waveform of the AC voltage signal is at a predetermined voltage, such as a zero-crossing for the waveform. The cameras may be configured to acquire image data based on detecting the predetermined voltage, or based at least in part on a frequency at which the predetermined voltage.

Generally, the microprocessors may be configurable to synchronize the acquisition of the image data with respect to each other, and based at least in part on analyzing the AC voltage signal. For instance, each of the microprocessors may receive an indication from their respective comparators circuits that a predetermined voltage has been detected. The microprocessors may simply be configured to acquire image data based on detecting the predetermined voltage on the waveform of the AC voltage signal. However, in some examples the microprocessors may be configured to obtain image data at a different, preconfigured frequency than that of the AC voltage signal. For instance, the microprocessors may each be configured to acquire the image data (i) at a different frequency than that of the AC voltage waveform (e.g., two times as often, half as often, one third as often, etc.), (ii) at a preconfigured time delay after detecting the predefined voltage, (iii) over a period of time from imaging sensors included in each camera, etc. Accordingly, the cameras may be configured to obtain or acquire image data based at least in part on AC voltage waveform and associated frequency, but according to various preconfigured parameters. In this way, the cameras may synchronize the acquisition of image data based at least in part on a frequency of a waveform of an AC voltage signal that provides power to the cameras.

In some instances, the cameras may further include, or be associated with, one or more lights (e.g., light emitting diodes (LEDs)) that may be strobed based on the frequency of the waveform of the AC voltage signal. For instance, the microprocessors of the cameras may further cause one or more light sources associated with the multi-camera system to emit light at least partly during a period of time during which the image data is generated by the imaging sensors of the cameras (e.g., overlapping at a beginning of the image data being generated, overlapping during the portion of time the image data is generated, overlapping at an end of the image data being generated, overlapping for the entirety of the time the image data is generated, etc.). In this way, the object represented in the image data that is read out from the imaging sensors may be illuminated by the one or more light sources.

While the techniques described below are primarily with respect to a multi-camera system on a mobile apparatus (e.g., tote), the techniques are equally applicable for any multi-camera system for which synchronization amongst the cameras is desired. For example, the techniques may be used in manufacturing industries to analyze objects being manufactured to detect defects from multiple angles, in security industries to identify objects or users using multi-camera systems to increase the accuracy, in entertainment industries to capture entertainment objects (e.g., actors/actresses, athletes, props, etc.), and/or other industries for which it may be desirable to synchronize or coordinate multi-camera systems. Additionally, the techniques need not be only for acquiring image data, but may further be used in other types of device for which synchronization is required. For example, the techniques may be equally applied to synchronize communications of data between devices in a system.

Although the techniques are described as being performed by a camera, the techniques are generally applicable to any type of imaging device or imaging sensor. For instance, the imaging sensors may include complementary metal oxide semiconductor (CMOS) cameras, charge-coupled device (CCD) sensors, active-pixel sensors (APS), and/or any other type of imaging sensor used to acquire image data under various lighting conditions, polarities, etc.

The techniques described herein enable synchronization of cameras in a multi-camera system using waveforms of AC power signals, such as AC voltage signals, AC current signals, etc. In this way, at least two goals may be accomplished at a same time by (i) powering the cameras using a power supply, and (ii) synchronizing the acquisition of image data by the cameras using the frequency of the waveform of the AC signal. In this way, the same cable/wire used to provide power to the cameras in the multi-camera system may be utilized to synchronize the acquisition of image data by the cameras. The techniques described herein may reduce the number of wires/cables used in the multi-camera system, and may reduce the complexity in design, cost, weight, etc., of the multi-camera system (and/or mobile apparatus).

Certain implementations and embodiments of the disclosure will now be described more fully below with reference to the accompanying figures, in which various aspects are shown. However, the various aspects may be implemented in many different forms and should not be construed as limited to the implementations set forth herein. The disclosure encompasses variations of the embodiments, as described herein. Like numbers refer to like elements throughout.

FIG. 1 illustrates a system-architecture diagram of an example environment 100 in which multiple cameras in a multi-camera system synchronize image acquisition based on a frequency of an alternating current (AC) power signal provided to each of the cameras. In the illustrated example, the cameras synchronize based on the frequency of the AC voltage signal.

As illustrated, the environment 100 may include a physical environment 102 in which an item-identifying tote 104 identifies items 106 placed in, and removed from, the tote 104 by a user 108. The tote 104 may include multiple cameras 114 (and/or proximity sensors) to detect an item 106 being placed in the tote 104, and generate image data 116 depicting the item 106, analyzes the image data 116 to identify an item identifier for the item 106, determines the event 110 involving the item 106 (e.g., add to tote, remove from tote, multiple items, quantity of items, etc.) and updates a virtual shopping cart using the item identifier.

As FIG. 1 depicts, the user 108 may have engaged in a shopping session in the materials handling facility. For instance, the user 108 may have selected an item 106 from an inventory location 112 (e.g., shelf, aisle, etc.) and placed the item 106 in the tote 104 (e.g., shopping cart). The inventory location 112 may house one or more different types of items 106 and the user 108 may pick (i.e., take, retrieve, etc.) one of these items 106. However, the physical environment 102 may comprise any type of environment in which cameras 114 may be synchronized to capture image data 116 representing an object (e.g., inanimate object, person, item, etc.) in the environment 102.

As illustrated, the tote 104 may include a multi-camera system 126 including multiple cameras 114 configured to acquire or capture image data 116 representing, for example, an item 106 (or any other portion in a physical environment 102). As illustrated, the multi-camera system may include a power supply 130 that provides AC power to multiple cameras 114(1), 114(2), to 114(N) (where "N" is any integer greater than "1"). The power supply 130 may comprise any type of battery supply configured to provide AC power to the cameras 114, and specific examples are discussed at least in FIG. 2.

The multi-camera system 128 may include a voltage bus 132 that provides AC power at a predefined AC voltage signal for the cameras 114 to consume to power the components included therein, and also to synchronize image data 116 acquisition as discussed herein. The voltage bus 132 may include any type of wires, cables, or conductive material configured to provide AC power to the cameras 114. For instance, the voltage bus 132 may comprise copper bars into which generated AC current is fed through which is then distributed to the cameras 114 to be consumed. The voltage bus 132 may be at a predefined AC voltage, have a predetermined waveform (e.g., sinusoidal waveform, square waveform, etc.), and be at a predefined frequency (e.g., 30 Hz, 60 Hz 120 Hz, etc.) based on the types of cameras 114 being used and their power supply requirements.

As illustrated, various voltage waveforms 134 may be used in the multi-camera system 128 to synchronize the image data 116 acquisition performed by each of the cameras 114 in the system 128. The voltage bus 132 may provide, in some examples, a sinusoidal AC voltage signal that is used to synchronize the cameras 114 such that each camera is standalone and scalable by monitoring the waveform and/or frequency of the AC voltage signal placed on the voltage bus 132. As described more fully in FIGS. 2, 3A, 3B, and 3C, the cameras 114 may each include a comparator circuit 136 configured to receive a first input signal corresponding to a positive portion (or phase) of the AC voltage waveform, and receive a second input signal corresponding to a negative portion (or phase) of the AC voltage waveform. The comparator circuit 136 may then identify predefined voltages on the AC voltage waveform that are used to synchronize image data 116 acquisition. As an example, the comparator 136 may determine when the positive portion of the waveform is greater than the negative portion of the waveform, such as when a zero-voltage crossing occurs and the negative phase transitions into the positive phase on the AC voltage waveform. In such examples, the comparator circuit 136 may output a logic high signal indicating that the predefined voltage was detected (e.g., 0 volts). Each camera 114 may include a microprocessor configured with instructions to synchronize image data 116 acquisition based on a same time at which the predefined voltage was detected on the waveform of the AC voltage signal. For instance, each of the microprocessors may detect the logic high signal output from the comparator circuit 136, and acquire image data based at least in part on detecting the logic high signal.

Based on the comparator circuit 136 detecting the predefined voltage on the waveform of the AC voltage signal (or otherwise determining a frequency of the AC voltage waveform), the cameras 114 may acquire image data 116 using a shutter signal 138. For instance, the cameras 114 may each output a shutter signal 138 to imaging sensors in the cameras 114 that results in a readout of the image data 116 generated by the imaging sensors of the cameras 114 (e.g., readout CMOS vector). In examples where mechanical shutters are utilized, the shutter signal 138 may cause the mechanical shutter to open for a predefined period of time to expose the sensors to light to generate the image data 116.

In some examples the microprocessors may be configured to obtain image data 116 at a different, preconfigured frequency than that of the AC voltage signal. For instance, the microprocessors may each be configured to acquire the image data 116 (i) at a different frequency than that of the AC voltage waveform (e.g., two times as often, half as often, one third as often, etc.), (ii) at a preconfigured time delay after detecting the predefined voltage, (iii) over a period of time from imaging sensors included in each camera, etc. Accordingly, the cameras 114 may be configured to obtain or acquire image data 116 based at least in part on analyzing the waveform of the AC voltage signal, but according to various preconfigured parameters. In this way, the cameras 114 may synchronize the acquisition of image data based at least in part on a frequency of a waveform of an AC voltage signal that provides power to the cameras.

In some instances, the cameras 114 may further strobe one or more light emitting diodes (LEDs) 140 associated with the cameras according at least partially at a same time as the shutter signal 138 is output to an imaging sensor of the camera 114. For instance, the LED(s) 140 may be strobed at a same time and/or same frequency as the shutter signal 138. In this way, the LED(s) 140 may strobe light to illuminate the item 106 as it is in the range of view of the cameras 114. In some examples, each of the cameras 114 may be associated with one or more respective LEDs 140 that are strobed to illuminate at least part of the field of view of each of the cameras 114. In some instances, the length of time that the LEDs 140 emit light according to a predefined period of time that is determined based on an amount of illumination desired in the image data 116 generated by the imaging sensors, and a desire to avoid blur due to exposure of the imaging sensors to the light emitted from the LEDs 140.

Generally, strobing the LEDs 140 may include ensuring that the turn-on time for a pulse-width modulation (PWM) signal of the LEDs 140 to be synchronized with the shutter signal 138 turn-on time (or exposure time). The turn-on time of the LEDs 140 may be the same, smaller, or bigger than the exposure time associated with the shutter signal 138 (e.g., rolling shutter) depending on the design requirements of the cameras 114, as long as the turn-on time of the LEDs 140 is in sync with the turn-on time of the shutters of the cameras 114. In examples where a global shutter is used, the LEDs 140 may be turned on continuously, but it may be desirable to synchronize turn-on and turn-off times of the LEDs 140 with the shutter signal 138 in order to save power. Thus, the LEDs 140 may be turned on when the global shutters of the cameras 114 are turned on (or during exposure) such that the LEDs 140 are synchronized with the global shutter signal 138.

In some examples, the image data 116 may be stored locally at the cameras 114, and in other examples, the cameras 114 and/or tote 104 may transmit the image data 116 to another device for storage and/or further analysis (e.g., server(s) 120). As an example, once the user 108 has finished their shopping session, the user 108 may end the shopping session and the list of item identifiers in the virtual shopping cart may be uploaded to one or more remote servers 120, over one or more networks 122, that manage user accounts for users 108 of the facility 102. The server(s) 120 may store the image data 116 in an image database 118 and/or perform further image analysis of the image data 116 using an image-analysis component 124 to determine an item 106 depict in image data 116. In some examples, the servers 120 may further charge the appropriate user account for the listing of the items in the virtual shopping cart that the user took from the environment 102. For instance, the server(s) 120 may be configured to determine or generate information indicative of a cost of the items 106 picked by the user 108. Additionally, the server(s) 120 may store payment information (e.g., credit card information, bank account information, etc.) for each user account. In this way, when the user 108 finished their shopping session and the tote 104 sends the listing of item identifiers in the virtual shopping cart over the network(s) 122 to the server(s) 120, the server(s) 120 may be configured to determine a cost or price for all of the listed item identifiers, and charge the user via their payment information for the items 106 selected during their shopping session. In this way, the user 108 need not go through steps of a traditional check-out experience (e.g., waiting in line for a cashier, scanning items with the cashier, paying for items at the cashier, etc.).

The network(s) 122 may include private networks such as an institutional or personal intranet, public networks such as the Internet, or a combination thereof. The network(s) 122 may utilize wired technologies (e.g., wires, fiber optic cable, and so forth), wireless technologies (e.g., radio frequency, infrared, acoustic, optical, and so forth), or other connection technologies. The network(s) 122 is representative of any type of communication network, including one or more of data networks or voice networks. The network(s) 122 may be implemented using wired infrastructure (e.g., copper cable, fiber optic cable, and so forth), a wireless infrastructure (e.g., cellular, microwave, satellite, etc.), or other connection technologies.

The tote 104 may include communication interface(s) such as devices configured to couple to personal area networks (PANs), wired and wireless local area networks (LANs), wired and wireless wide area networks (WANs), and so forth. For example, the communication interfaces may include devices compatible with Ethernet, Wi-Fi™, and so forth. In some examples, the communication interface(s) may encode the data prior to sending over the network(s) 122 according to the type of protocol or standard being used. As noted above, in some examples, the servers 120 may perform some or all of the operations described below as being performed by the tote 104. While the servers 120 are illustrated as being in a location outside of the facility 102, in other implementations, at least a portion of the servers 122 may be located at the facility 102.

Figure 2:
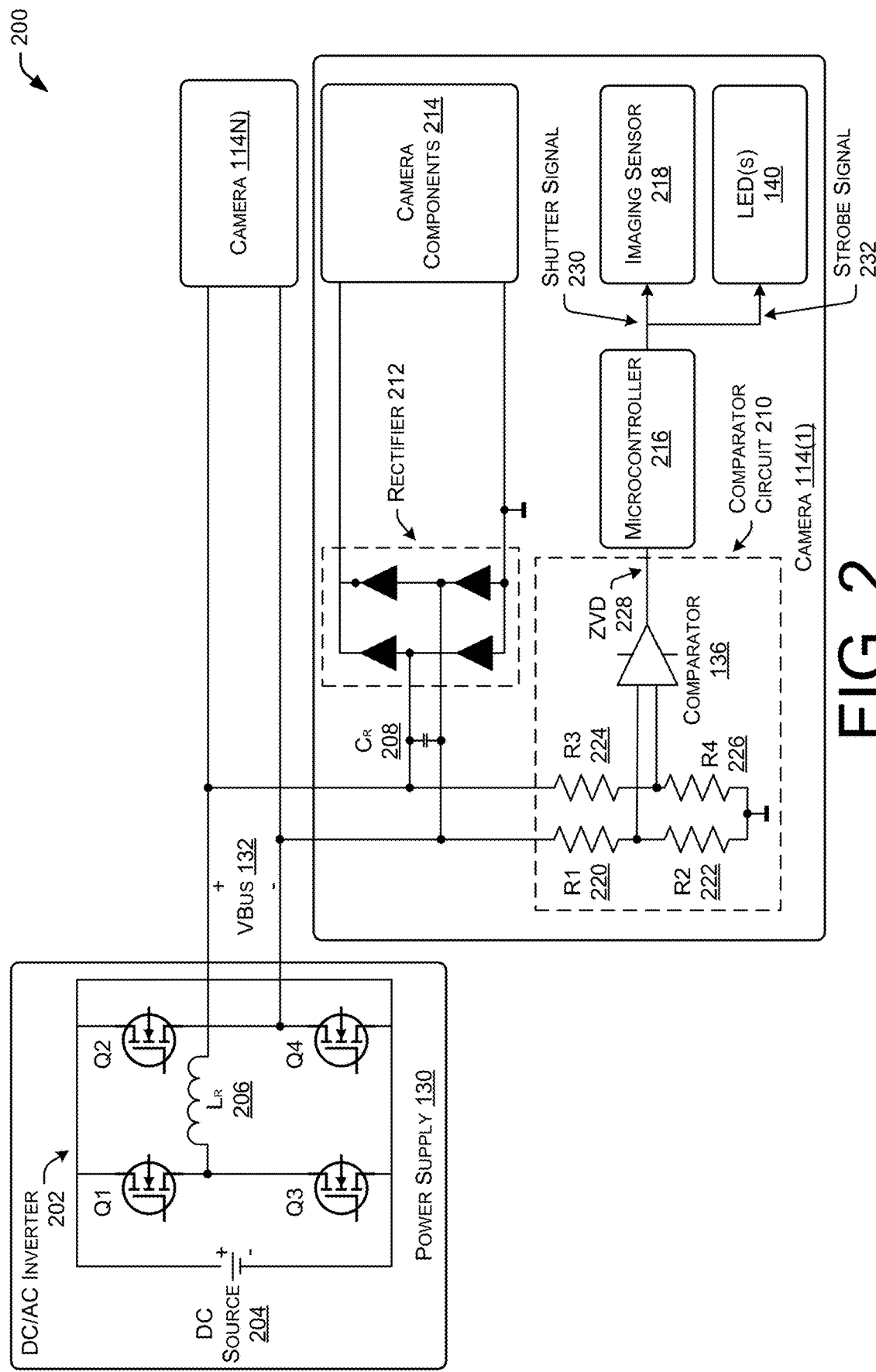
FIG. 2 illustrates a system-architecture diagram of an example circuit for a camera to use an AC voltage waveform to synchronize image acquisition with other cameras in a multi-camera system.

FIG. 2 illustrates a system-architecture diagram 200 of an example circuit for a camera 114 to use an AC voltage waveform to synchronize image data acquisition with other cameras 114 in a multi-camera system 126.

The power supply 130 of the tote 104 may comprise any type of power supply configured to provide AC power to a camera 114. In examples where the cameras 114 are in a mobile system, the power supply 130 may include a DC source 204, such as a battery. The DC source 204 may comprise any type of DC power source, such as one or more of a Lithium-ion (Li-ion) battery, a Nickel Cadmium (Ni—Cd) battery, a Nickel-Metal Hydride (Ni-MH) battery, a Lead-Acid battery, and/or any other type of battery. However, the DC source 204 need not be a portable source and may be received from a mains power source.

The power supply 130 may include a DC/AC converter 202 configured to convert the DC source 204 into AC power by converting the DC voltage signal into an AC voltage signal. The DC/AC converter 202 is illustrated as a DC/AC resonant inverter comprising multiple MOSFETS to switch according to known techniques to convert the DC signal into an AC signal. Additionally, the power supply 130 may include an inductor 206 and the cameras 114 may include a capacitor 208 to absorb unwanted L and C parasitic cause by the length of the cable of the voltage bus 132. The power supply 130 may include a resonant tank, and in other examples may not include the resonant tank such that the voltage bus 132 would be a rectangular waveform. Additionally, the resonant tank shown by inductor 206 and capacitor 208 may be arranged in other configurations to comprise a resonant tank (e.g., series resonant tank, parallel resonant tank, series-parallel resonant tank, etc.). Further, the DC/AC inverter 202 may comprise any type of DC-AC inverter known in the art.

In some examples, the power supply 130 may comprise any type of AC power supply 130 known in the art, and need not necessarily include a DC source 204 and DC/AC inverter 202. For instance, the power supply 130 may comprise a mains power source, such as a socket in a building that receives power from a power grid. As another example, the power supply 130 may comprise a generator that generates AC power for use by the cameras 114. However, the power supply 130 may generally comprise any type of power supply 130 configured to output AC power using an AC voltage waveform (e.g., sinusoidal waveform, square waveform, triangle waveform, sawtooth waveform, etc.).

Each of the cameras 114 may include various circuits and components for synchronizing image data acquisition based on the waveform and/or frequency of an AC voltage signal on the AC voltage bus 132. As shown, the camera 114 may include a rectifier 212 configured to convert the AC voltage bus 132 into a DC voltage to be used by camera components 214 of the cameras 114 that are powered using DC power. The rectifier is illustrated as a simple arrangement of components to convert the AC voltage signal into a DC voltage signal, but any other type of rectifier may be used that include additional components and/or less components to converting the AC voltage signal into a DC voltage signal.

The cameras 114 may further include a comparator circuit 210 configured to monitor the waveform of the AC voltage signal of the voltage bus 132. As illustrated, the comparator circuit 210 may include a first voltage divider including resistors 220 and 222 that divides the voltage from the negative phase of the voltage bus 132, and may further include a second voltage divider including resistors 224 and 226 that divides the voltage from the positive phase of the voltage bus 132. The comparator circuit 210 may further include the comparator 136 configured to analyze the waveform of the AC voltage signal by comparing the negative portion of the waveform to the positive portion of the waveform. The comparator 136 may comprise any type of device configured to compare two voltages, or two currents, and output a digital signal indicating which is larger. The comparator 136 may include a high-gain differential amplifier, an op-amp voltage comparator, an optocoupler, and/or any other type of device configured to compare two voltages or two currents.

In the illustrated example, the inputs into the comparator 136 may include a first input signal corresponding to a positive portion of the AC voltage waveform of the voltage bus 132, and a second input signal corresponding to a negative portion of the AC voltage waveform of the voltage bus 132. The comparator 136 may compare the input signals and output an indication (e.g., logic high signal) to the microprocessor of when the waveform of the AC voltage signal is at a predetermined voltage, such as a zero-crossing for the waveform. As illustrated, the comparator 136 may output a zero-voltage detection (ZVD) signal 228 indicating that, for example, a zero-voltage crossing has been detected for the waveform of the AC voltage signal.

In some examples, the comparator 136 may determine when the positive portion of the waveform is greater than the negative portion of the waveform, such as when a zero-voltage crossing occurs and the negative phase transitions into the positive phase on the AC voltage waveform (and/or when the positive phase transitions into the negative phase on the AC voltage waveform). In such examples, the comparator 136 may output a logic high signal (or logic low signal depending on the circuit) indicating that the predefined voltage was detected (e.g., 0 volts).

Each camera 114 may include a microprocessor 216 configured to detect the ZVD signal 228 indicating the predefined voltage has been detected. The microcontroller 216 may, based at least in part on detecting the ZVD signal 228, output a shutter signal 230 to an imaging sensor 218 of the camera 114. Generally, the shutter signal 230 may cause readout of at least a portion of the image data 116 generated by the imaging sensor 218 at a particular time, and/or over a preconfigured period of time.

The microcontroller 216 may further synchronize the shutter signal 230 with a strobe signal 232 that causes the LED(s) 140 to emit light. For instance, the shutter signal 230 may cause the imaging sensor 218 to obtain image data such that the image data is generated at least partly while the imaging sensor 218 is exposed to light emitted by the LED(s) 140. Thus, the strobe signal 232 may cause the LED(s) 140 to emit light at least partly at a same time as the imaging sensor 218 captures or obtains image data.

As shown, the voltage bus 132 may provide the AC voltage signal to multiple cameras 114(N) in the multi-camera system 128 to synchronize the acquisition of image data by each of the cameras 114 in the system 128.

Generally, each camera 114 may use any type of ZVD 228 signal, or other signal that indicates a predefined voltage and/or frequency of an AC voltage waveform. Accordingly, any type of circuit may be used to monitor the voltage bus 132 and detect a predefined frequency and output a ZVD signal 228 to the microcontroller. For instance, the comparator circuit 210 may be modified in various ways. As an example, it may be advantageous to use R1 220 and R2 222 as a voltage divider and R3 224 and R4 226 as another voltage divider to provide a clean differential voltage across the inputs of the comparator 136. However, in some examples, one or more of the resistors 220, 222, 224, and/or 226 may be removed while still providing the positive and negative portions of the AC voltage waveform as inputs to the comparator 136.

In some instances, the ZVD signal 228 may be output by a different component or circuit altogether. For instance, an optocoupler may be used to detect the zero-voltage crossing(s) of the AC voltage waveform. The AC voltage signal may be applied across terminals such that a diode is in parallel with the AC voltage, and/or having a resistor disposed between the diode and the AC voltage. The optocoupler may be in parallel with the diode, and an output of the optocoupler may be coupled to a voltage (Vcc). When the AC voltage signal is positive, the diode is reverse biased and the optocoupler turns on such that the ZVD signal 228 is logic low. Conversely, when the AC voltage signal is negative, the diode conducts and is forward biased, and the optocoupler turns off resulting in a ZVD signal being logic high.

FIG. 3A illustrates a diagram 300A of example waveforms illustrating the synchronization of image acquisition by cameras in a multi-camera system. In the illustrated example, the cameras 114 synchronize their image acquisition based on detecting that the AC voltage signal of a supply voltage has transitioned from a negative phase into a positive phase (e.g., zero-crossing point), but at a different frequency than that of the AC voltage waveform.

As illustrated, a voltage bus signal 302 may comprise a sinusoidal waveform that is analyzed by components of each camera 114 in the multi-camera system 126. As illustrated, the comparator circuit 210 may output the ZVD signal 304 based at least in part on detecting the zero-voltage of the voltage bus signal 302. The ZVD signal 304 may indicate when the negative portion of the waveform of the voltage bus signal 302 transitions into a positive portion of the waveform. In some examples, the ZVD signal 304 may be a logic high signal, and in other examples, logic low signals may indicate the zero-voltage crossing depending on the circuit.

Based on detecting the ZVD signal 304, the microcontroller 216 may output a shutter signal 306 indicating that an imaging sensor 218 is to readout image data 116 generated by the imaging sensor 218. The shutter signal 306 may be performed over a period of time determined, based at least in part on the ZVD signal 304 (e.g., different frequency, delay after detecting the ZVD signal 304, etc.). In some instances, the cameras 114 may include or be associated with a light that is further configured to emit light, or strobe, for a period of time that at least partially overlaps with the period of time for which image data 116 is obtained from the imaging sensor 218.

As illustrated, the microcontroller 216 may further output a light strobe 308 to one or more LED(s) 140 to cause light to be emitted in sync with the shutter signal 306 to obtain the image data. Thus, the microcontroller 216 may synchronize the shutter signal 306 with the light strobe 308 such that an LED 140 emits light at least partly at a same time as an imaging sensor obtains image data where the imaging sensor is exposed to the emitted light.

The voltage bus signal 302 may have a period that is based on an inverse of the frequency of the DC/AC inverter 202.

FIG. 3B illustrates a diagram 300B of additional example waveforms illustrating the synchronization of image acquisition by cameras in a multi-camera system. In the illustrated example, the cameras synchronize their image acquisition based on detecting that the AC voltage signal of a supply voltage has transitioned from a positive phase into a negative phase (e.g., zero-crossing point), and at a same frequency than that of the AC voltage waveform.

As illustrated, a voltage bus signal 320 may comprise a sinusoidal waveform that is analyzed by components of each camera 114 in the multi-camera system 126. As illustrated, the comparator circuit 210 may output the ZVD signal 322 based at least in part on detecting the zero-voltage of the voltage bus signal 320. The ZVD signal 322 may indicate when the positive portion of the waveform of the voltage bus signal 320 transitions into a negative portion of the waveform. In some examples, the ZVD signal 322 may be a logic high signal, and in other examples, logic low signals may indicate the zero-voltage crossing depending on the circuit.

Based on detecting the ZVD signal 322, the microcontroller 216 may output a shutter signal 326 indicating that an imaging sensor is to readout image data 116 generated by the imaging sensor 218. The shutter signal 326 may be performed over a period of time determined, based at least in part on the ZVD signal 322 (e.g., different frequency, delay after detecting the ZVD signal 322, etc.). In some instances, the cameras 114 may include or be associated with a light that is further configured to emit light 328, or strobe, for a period of time that at least partially overlaps with the period of time for which image data 116 is obtained from the imaging sensor 218. The light emission 328 may be caused by a signal that is at a same, or approximately the same, frequency as the imaging sensor readout 326.

As illustrated, the microcontroller 216 may further output a light strobe 328 to one or more LED(s) 140 to cause light to be emitted in sync with the shutter signal 326 to obtain the image data. Thus, the microcontroller 216 may synchronize the shutter signal 326 with the light strobe 328 such that an LED 140 emits light at least partly at a same time as an imaging sensor obtains image data where the imaging sensor is exposed to the emitted light.

The voltage bus signal 320 may have a period that is based on an inverse of the frequency of the DC/AC inverter 202.

Figure 3C:
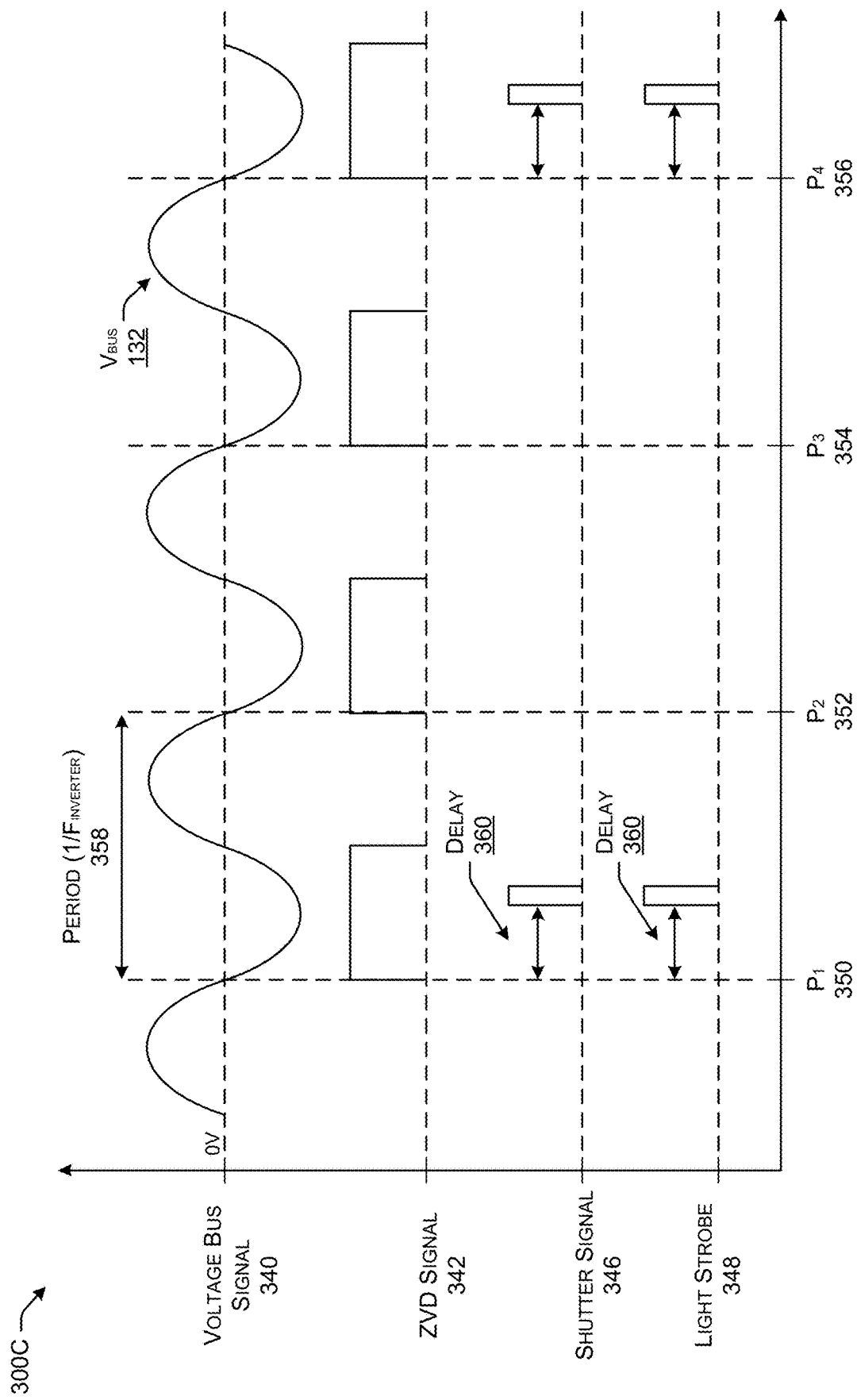
FIG. 3C illustrates a diagram of further example waveforms illustrating the synchronization of image acquisition by cameras in a multi-camera system. In the illustrated example, the cameras synchronize their image acquisition based on detecting that the AC voltage signal of a supply voltage has transitioned from a positive phase into a negative phase, but at a different frequency than that of the AC voltage waveform at a delay from at time at which the predefined voltage was detected.

FIG. 3C illustrates a diagram of further example waveforms illustrating the synchronization of image acquisition by cameras in a multi-camera system. In the illustrated example, the cameras synchronize their image acquisition based on detecting that the AC voltage signal of a supply voltage has transitioned from a positive phase into a negative phase, but at a different frequency than that of the AC voltage waveform at a delay from at time at which the predefined voltage was detected.

As illustrated, a voltage bus signal 340 may comprise a sinusoidal waveform that is analyzed by components of each camera 114 in the multi-camera system 126. As illustrated, the comparator circuit 210 may output the ZVD signal 342 based at least in part on detecting the zero-voltage of the voltage bus signal 340. The ZVD signal 342 may indicate when the positive portion of the waveform of the voltage bus signal 340 transitions into a negative portion of the waveform. In some examples, the ZVD signal 342 may be a logic high signal, and in other examples, logic low signals may indicate the zero-voltage crossing depending on the circuit.

Based on detecting the ZVD signal 322, the microcontroller 216 may output a shutter signal 346 that causes an imaging sensor to readout image data 116 generated by the imaging sensor 218. The shutter signal 346 may be performed over a period of time determined, based at least in part on the ZVD signal 342 (e.g., different frequency, delay after detecting the ZVD signal 342, etc.). In some instances, the cameras 114 may include or be associated with a light that is further configured to emit light 348, or strobe, for a period of time that at least partially overlaps with the period of time for which image data 116 is obtained from the imaging sensor 218. The light emission 348 may be caused by a signal that is at a same, or approximately the same, frequency as the imaging shutter signal 346.

As illustrated, the microcontroller 216 may further output a light strobe 348 to one or more LED(s) 140 to cause light to be emitted in sync with the shutter signal 346 to obtain the image data. Thus, the microcontroller 216 may synchronize the shutter signal 346 with the light strobe 348 such that an LED 140 emits light at least partly at a same time as an imaging sensor obtains image data where the imaging sensor is exposed to the emitted light.

As illustrated, the shutter signal 346 and light strobe signal 348 may be synchronized at a same time (or at least partially overlapping), but at a delay 360 from the ZVD signal 342 that is programmed into the microcontroller 216. Further, the microcontroller 216 may be configured to output the shutter signal 346 and light strobe 348 according to a different frequency that that at which the ZVD signal 342 is output (e.g., ⅓ as frequent). However, the delay 360 may comprise any delay within the period 358 of the voltage bus signal 340, and the frequency at which the shutter signal 346 and light strobe 348 may be any frequency the same as, or different, from (but based on) the ZVD signal 342. That is, the ZVD signal 342 may be used by the microcontroller 216 to synchronize each of the cameras 114, but the delay and frequency at which the shutter signals 346 and light strobes 348 may be configured according various delays and/or frequencies.

FIGS. 4A, 4B, 5, and 6 illustrate flow diagrams of example methods 400, 500, and 600 that illustrate aspects of the functions performed at least partly by the cameras 114 in the multi-camera system 128 described in this disclosure. The logical operations described herein with respect to FIGS. 1-3B may be implemented (1) as a sequence of computer-implemented acts or program modules running on a computing system and/or (2) as interconnected machine logic circuits or circuit modules within the computing system.

The implementation of the various components described herein is a matter of choice dependent on the performance and other requirements of the computing system. Accordingly, the logical operations described herein are referred to variously as operations, structural devices, acts, or modules. These operations, structural devices, acts, and modules can be implemented in software, in firmware, in special purpose digital logic, and any combination thereof. It should also be appreciated that more or fewer operations might be performed than shown in the FIGS. 4A, 4B, 5, and 6 and described herein. These operations can also be performed in parallel, or in a different order than those described herein. Some or all of these operations can also be performed by components other than those specifically identified. Although the techniques described in this disclosure is with reference to specific components, in other examples, the techniques may be implemented by less components, more components, different components, or any configuration of components.

Figure 4B:
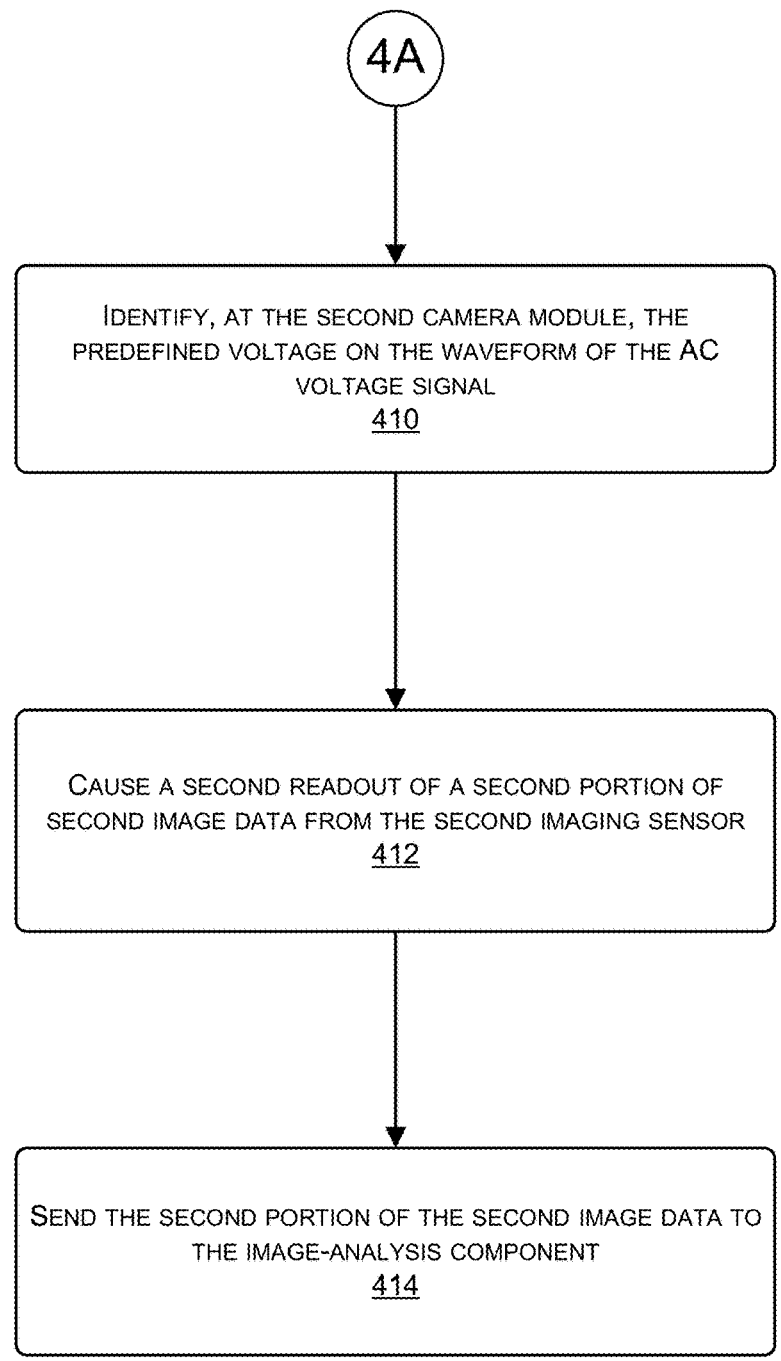

FIGS. 4A and 4B collectively illustrate a flow diagram of an example method 400 for synchronizing readout of imaging sensors of multiple cameras in a multi-camera system. In some examples, the method 400 may be performed by a multi-camera system 128 that includes a power supply 130 configured to supply alternating current (AC) power via an AC voltage signal, a first camera module, and a second camera module.

At 402, the power supply 130 may supply AC power via an AC voltage signal to the first camera module and the second camera module (e.g., cameras 114). In some examples, the power supply 130 may simply comprise an AC power supply that receives power from a mains power source, such as a power grid. In some instances, the power supply 130 may include a DC source (e.g., battery) that outputs a voltage to a DC/AC inverter that outputs an AC voltage signal for use by the cameras 114.

At 404, one or more first processors of the first camera module may identify a predefined voltage on a waveform of the AC voltage signal (e.g., zero-crossing point of 0V). For example, the first camera module (e.g., camera 114(1)) may identify a zero crossing on the waveform of the AC voltage signal. In some instances, the first camera module may further comprise a comparator circuit 210 configured to receive a first input signal corresponding to a positive portion of the waveform of the AC voltage signal, receive a second input signal corresponding to a negative portion of the waveform of the AC voltage signal, and based at least in part on the first input signal being greater than or equal to the second input signal, output a logic high signal to the one or more first processors indicating the predefined voltage on the waveform.

At 406, the first camera module may, based at least in part on identifying the predefined voltage on the waveform of the AC voltage signal, cause a first readout of a first portion of the first image data from the first imaging sensor. For instance, the first camera module 114 may output a shutter signal 230 based at least in part on a time at which the predefined voltage was identified on the waveform of the AC voltage signal. In some instances, the first camera module 114 may synchronize the shutter signal 230 with a strobe signal 232 such that LED(s) 140 emit light at least partly during a time the image data is generated by the first imaging sensor.

In some examples, the waveform of the AC voltage signal is at a first frequency, and causing the first readout of the first portion of the first image data comprises outputting a first shutter signal to trigger the first readout according to at least one of: (i) a predefined period of time over which the first portion of the first image data is read from the first imaging sensor, (ii) a predefined time delay between identifying the predefined voltage on the waveform and reading out the first portion of the first image data, or (iii) a second frequency according to which the first shutter signal is to be output, wherein the second frequency is different than the first frequency. At 408, the first camera module may store the first portion of the first image data at the first camera module.

At 410, the second camera module may identify the predefined voltage on the waveform of the AC voltage signal. In some examples, the second camera module may identify the predefined voltage on the waveform at a same time, or approximately the same time, as the first camera module identifies the predefined voltage.

At 412, the second camera module may, based at least in part on identifying the predefined voltage on the waveform of the AC voltage signal, cause a second readout of a second portion of the second image data from the second imaging sensor. In some instances, the first camera module and second camera module may obtain the respective image data at a same time, or approximately the same time, and according to a same frequency determined based at least in part on the time/frequency at which the predefined voltage on the waveform is detected. At 414, the second camera module may store the second portion of the second image data at the second camera module.

As described herein, causing a readout of a portion of image data from an imaging sensor may include outputting, from a microcontroller 216, a shutter signal 230 to an imaging sensor 218 that causes the imaging sensor 218 to capture, obtain, and/or store image data. Generally, the imaging sensor may include circuitry and/or components (e.g., graphical processing unit (GPU)) that is configured to capture or generate image data using a sensor, such as a CMOS sensor.

Figure 5:
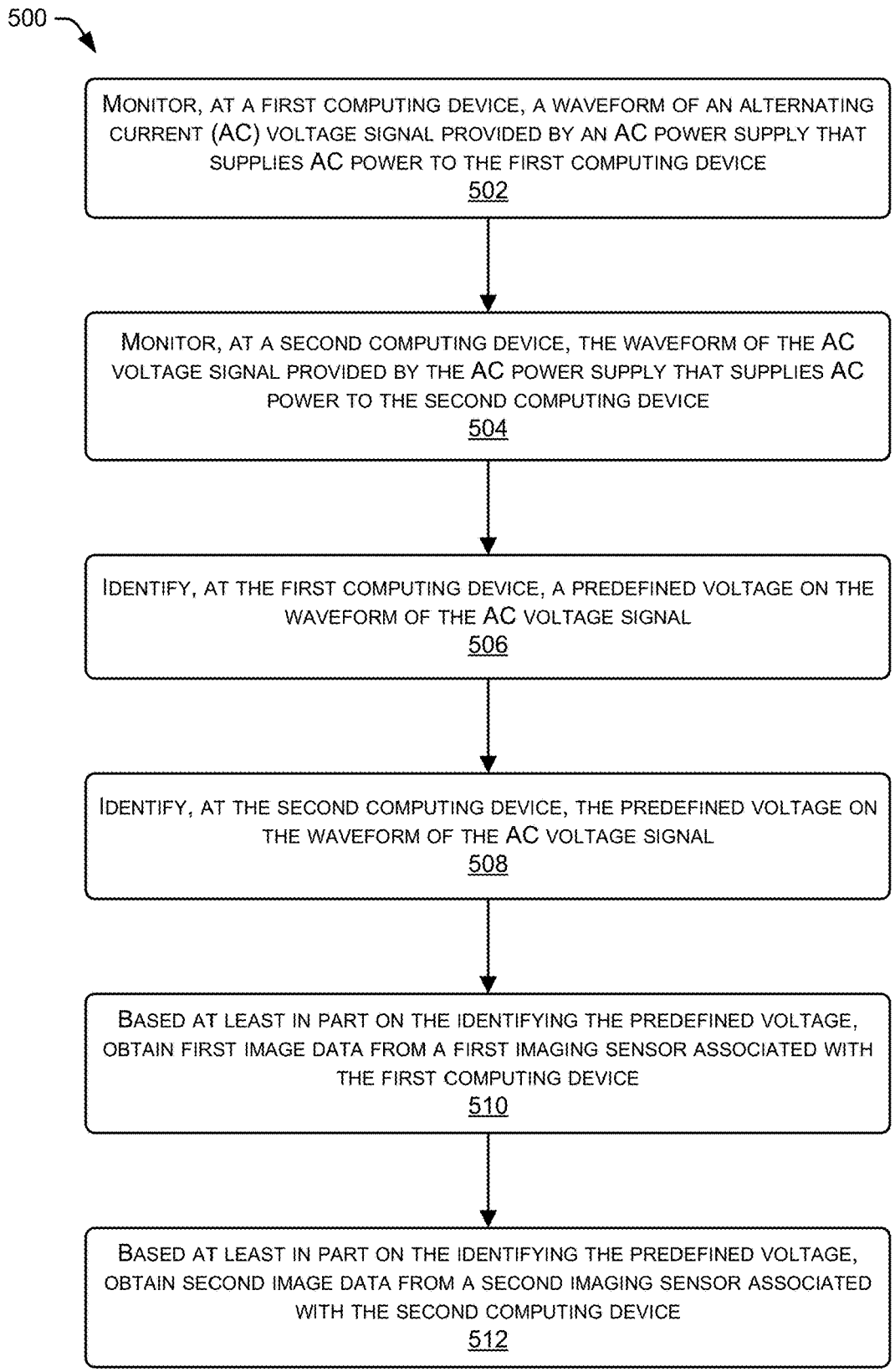
FIG. 5 illustrates a flow diagram of an example method for synchronizing image data acquisition among two computing devices that are associated with imaging sensors using a predefined voltage on an AC voltage waveform.

FIG. 5 illustrates a flow diagram of an example method 500 for synchronizing image data acquisition among two computing devices that are associated with imaging sensors using a predefined voltage on an AC voltage waveform.

At 502, a first computing device (e.g., camera 114), may monitor a waveform of an alternating current (AC) voltage signal provided by an AC power supply that supplies AC power to the first computing device. For instance, the first computing device may include a comparator circuit 210 that has inputs configured to receive a positive portion of an AC waveform and a negative portion of the AC waveform.

For instance, monitoring, at the first computing device, the waveform of the AC voltage signal may comprise receiving, at a comparator circuit of the first computing device, a first input signal corresponding to a positive portion of the waveform, and receiving, at the comparator circuit, a second input signal corresponding to a negative portion of the waveform.

At 504, a second computing device (e.g., camera 114), may monitor the waveform of the AC voltage signal provided by the AC power supply that supplies AC power to the second computing device.

At 506, the first computing device may identify a predefined voltage on the waveform of the AC voltage signal. In some examples, identifying, at the first computing device, the predefined voltage on the waveform may comprise detecting, by the comparator circuit, that the first input signal is greater than or equal to the second input signal, and based at least in part on the first input signal being greater than or equal to the second input signal, outputting, from the comparator circuit, an indication of the predefined voltage on the waveform. At 508, the second computing device may identify the predefined voltage on the waveform of the AC voltage signal. In some examples, identifying, at the second computing device, the predefined voltage on the waveform of the AC voltage signal comprises determining that the at least one of the negative portion of the waveform transitions to the positive portion of the waveform or the positive portion of the waveform transitions to the negative portion.

At 510, the first computing device may, based at least in part on the identifying the predefined voltage, obtain first image data from a first imaging sensor associated with the first computing device. In some instances, obtaining the first image data from the first imaging sensor comprises reading the first image data from the first imaging sensor over a predefined period of time. In various examples, obtaining the first image data from the first imaging sensor comprises reading the first image data from the first imaging sensor subsequent to a predefined time delay after identifying the predefined voltage on the waveform of the AC voltage signal.

At 512, the second computing device may, based at least in part on the identifying the predefined voltage, obtain second image data from a second imaging sensor associated with the second computing device. In some instances, obtaining the second image data from the second imaging sensor comprises reading the second image data from the second imaging sensor over the predefined period of time. In various examples, obtaining the second image data from the second imaging sensor comprises reading the second image data from the second imaging sensor subsequent to the predefined time delay after identifying the predefined voltage on the waveform of the AC voltage signal.

In some examples, the first image data is obtained over a period of time and the second image data is obtained over the period of time. The method 500 may further comprise causing, by the first computing device, a first light source to emit light at least partly during the period of time, the first light source being associated with the first imaging sensor, and causing, by the second computing device, a second light source to emit light at least partly during the period of time, the second light source being associated with the second imaging sensor.

FIG. 6 illustrates a flow diagram of another example method 600 for synchronizing image data acquisition among two computing devices that are associated with imaging sensors using a frequency of an AC voltage waveform.

At 602, a first device may monitor a waveform associated with an alternating current (AC) voltage signal provided by a power supply that supplies power to the first device. At 604, the first device may determine first frequency data indicative of a frequency of the waveform associated with the AC voltage signal. At 606, the first device may, based at least in part on the frequency of the waveform, obtain first image data from the first imaging sensor, the first image data being generated by the first imaging sensor at least at a particular time.

At 608, a second device may monitor the waveform associated with the AC voltage signal provided by the power supply that supplies power to the second device. At 610, the second device may determine second frequency data indicative of the frequency of the waveform associated with the AC voltage signal. At 612, the second device may, based at least in part on the frequency of the waveform, obtain, at the particular time, second image data from the second imaging sensor, the second image data being generated by the second imaging sensor at least at the particular time.

Figure 7:
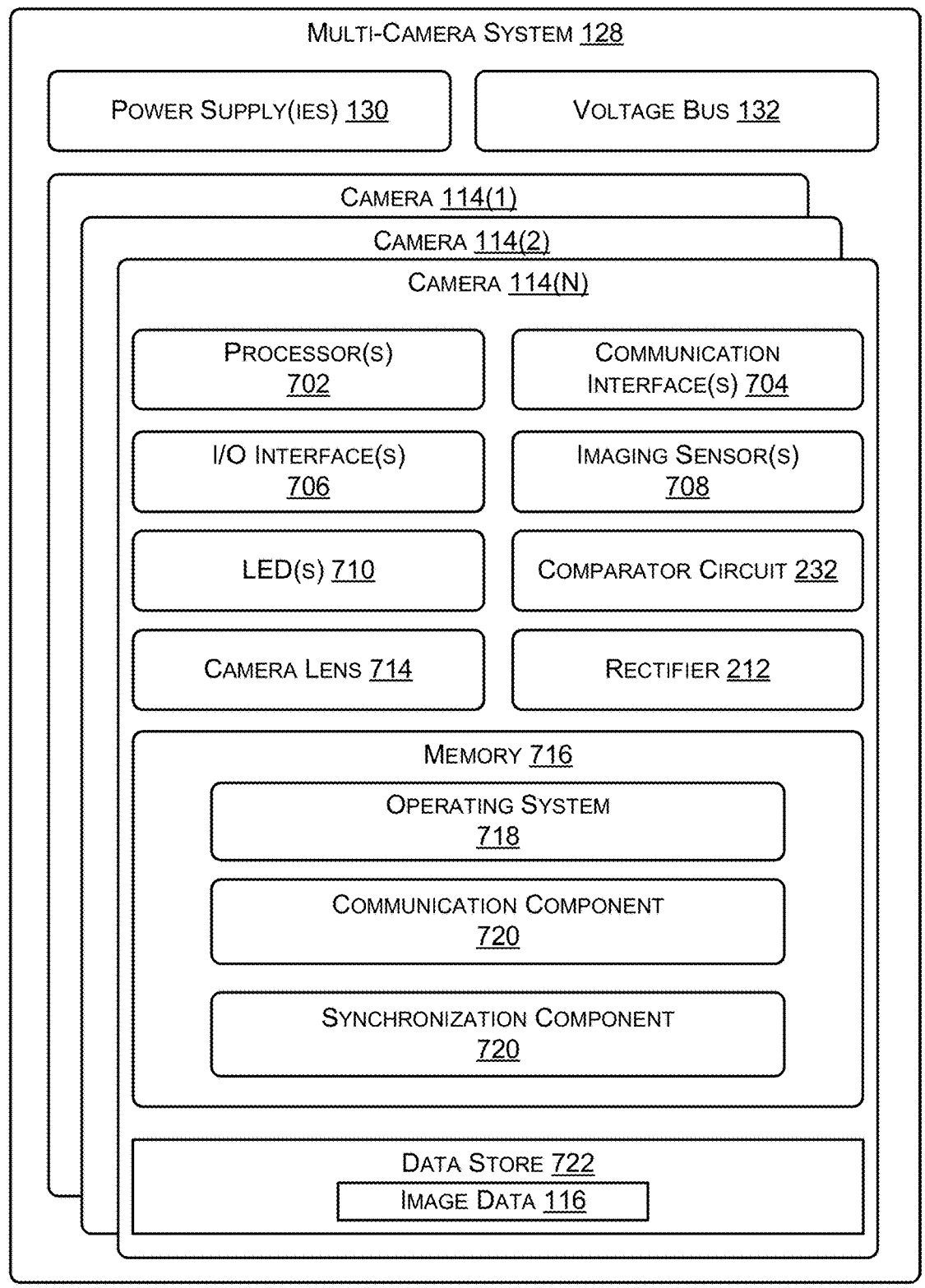
FIG. 7 illustrates a component diagram of example components of a multi-camera system configured for synchronize image data acquisition with multiple cameras in a system of cameras using a waveform associated with an AC power supply, such as an AC voltage waveform.

FIG. 7 illustrates a component diagram of example components of a multi-camera system 128 configured for synchronize image data acquisition with multiple cameras in a system of cameras using a waveform associated with an AC power supply, such as an AC voltage waveform.

As illustrated, the multi-camera system 128 may include the one or more power supplies 130 described herein, as well as the voltage bus 132 described herein. The power supply(ies) 130 provide power to the components of the tote 104 and cameras 114, and may comprise a battery pack module. The power supply(ies) 130 may also include a secondary (e.g., internal) power supply 130 to allow for hot swapping of battery pack modules, such as one or more capacitors, internal batteries, etc.

The cameras 114 may comprise 104 may comprise any type of camera or imaging device configured to generate image data (and/or video data), or information descriptive of a plurality of picture elements or pixels. The cameras 114 may generate image data by, for example, exposing the cameras imaging sensor(s) 708 for predefined durations, such as by strobing the opening and closing of shutters of the cameras 114 (for mechanical shutters), and/or by selectively obtaining image data generated using imaging sensors 708 for digital cameras that do not include mechanical shutters.

The cameras 114 may include one or more processors 702 and memory 716. In some implementations, the processors(s) 702 may include a central processing unit (CPU), a graphics processing unit (GPU), both CPU and GPU, a microprocessor, a digital signal processor or other processing units or components known in the art. Alternatively, or in addition, the functionally described herein can be performed, at least in part, by one or more hardware logic components. For example, and without limitation, illustrative types of hardware logic components that can be used include field-programmable gate arrays (FPGAs), application-specific integrated circuits (ASICs), application-specific standard products (ASSPs), system-on-a-chip systems (SOCs), complex programmable logic devices (CPLDs), etc. Additionally, each of the processor(s) 702 may possess its own local memory, which also may store program modules, program data, and/or one or more operating systems.

The cameras 114 (and/or the tote 104) may additionally include one or more communication interfaces 704. The communication interfaces 704 are configured to provide communications between the cameras 114 and other devices, such as the tote 104, the server(s) 120, sensors, interface devices, routers, and so forth. The communication interfaces 704 may include devices configured to couple to personal area networks (PANs), wired and wireless local area networks (LANs), wired and wireless wide area networks (WANs), and so forth. For example, the communication interfaces 704 may include devices compatible with Ethernet, Wi-Fi™, and so forth. The cameras 114 and/or totes 104 may also include one or more busses or other internal communications hardware or software that allow for the transfer of data between the various modules and components of the camera and/or totes 104.

The cameras 114 may additionally include one or more input/output (I/O) interface(s) 706 to allow the processor 702 or other portions of the cameras 114 to communicate with other devices. The I/O interfaces 706 may comprise Inter-Integrated Circuit (I2C), Serial Peripheral Interface bus (SPI), Universal Serial Bus (USB) as promulgated by the USB Implementers Forum, and so forth. The I/O interfaces 706 may allow the various modules/components to communicate with each other and/or control each other.

The cameras 114 may include, or be associated with, one or more LEDs 710 that may be selectively activated to emit light at any wavelength, visible or non-visible to, according to a predetermined frequency (e.g., at times that at least partially overlap with image data being generated by the imaging sensors 708). The cameras 114 may include or be associated with one or more imaging sensors 708 configured to receive light passing through the camera lens 714, and convert them into electrical signals (e.g., generate image data 116). The camera lens 714 may be configured to receive and adjust the camera object so as to realize the optical imaging.

The cameras 114 may further include the memory 716 that may comprise computer-readable media and may include volatile and nonvolatile memory, removable and non-removable media implemented in any method or technology for storage of information, such as computer-readable instructions, data structures, program modules, or other data. Such memory includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, RAID storage systems, or any other medium which can be used to store the desired information and which can be accessed by a computing device. The computer-readable media may be implemented as computer-readable storage media ("CRSM"), which may be any available physical media accessible by the processor(s) 702 to execute instructions stored on the memory 716. In one basic implementation, CRSM may include random access memory ("RAM") and Flash memory. In other implementations, CRSM may include, but is not limited to, read-only memory ("ROM"), electrically erasable programmable read-only memory ("EEPROM"), or any other tangible medium which can be used to store the desired information and which can be accessed by the processor(s) 702.

Several modules such as instruction, datastores, and so forth may be stored within the memory 716 and configured to execute on the processor(s) 702. A few example functional modules are shown as applications stored in the memory 716 and executed on the processor(s) 702, although the same functionality may alternatively be implemented in hardware, firmware, or as a system on a chip (SOC).

An operating system module 718 may be configured to manage hardware and services within the cameras 114. The memory 716 may further store a communication component 720 that may be configured to establish communications with one or more of sensors, servers, other cameras 114, other devices, etc., according to various communication protocols for communicating over various media and/or networks.

Further, the memory 716 may store a synchronization component 720 configured to perform at least portions of the synchronization techniques described herein. Generally, the synchronization component 720 may be configured to perform techniques described as being performed by the microcontroller 216 such as detecting the zero-voltage detection signal 228, and performing operations for synchronizing the acquisition of image data 116 from the imaging sensor(s) 708 and/or synchronizing the emissions of light from LED(s) 710 to illuminate objects depicted in the image data 116.

The cameras 114 may further include a wireless unit coupled to an antenna to facilitate a wireless connection to a network. The wireless unit may implement one or more of various wireless technologies, such as Wi-Fi, Bluetooth, RF, and so on.

While the foregoing invention is described with respect to the specific examples, it is to be understood that the scope of the invention is not limited to these specific examples. Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Although the application describes embodiments having specific structural features and/or methodological acts, it is to be understood that the claims are not necessarily limited to the specific features or acts described. Rather, the specific features and acts are merely illustrative some embodiments that fall within the scope of the claims of the application.

What is claimed is:

1. A system comprising:
a power supply configured to supply alternating current (AC) power via an AC voltage signal;
a first camera module comprising:
a first imaging sensor configured to generate first image data; and
one or more first processors comprising one or more first computer-executable instructions that, when executed, cause the one or more first processors to perform first operations comprising:
identifying a predefined voltage on a waveform of the AC voltage signal;
based at least in part on identifying the predefined voltage on the waveform of the AC voltage signal, causing a first readout of a first portion of the first image data from the first imaging sensor; and
storing the first portion of the first image data at the first camera module; and
a second camera module comprising:
a second imaging sensor configured to generate second image data; and
one or more second processors comprising one or more second computer-executable instructions that, when executed, cause the one or more second processors to perform second operations comprising:
identifying the predefined voltage on the waveform of the AC voltage signal;
based at least in part on identifying the predefined voltage on the waveform of the AC voltage signal, causing a second readout of a second portion of the second image data from the second imaging sensor; and
storing the second portion of the second image data at the second camera module.

2. The system of claim 1, wherein the first camera module further comprises a comparator circuit configured to:
receive a first input signal corresponding to a positive portion of the waveform of the AC voltage signal;
receive a second input signal corresponding to a negative portion of the waveform of the AC voltage signal; and
based at least in part on the first input signal being greater than or equal to the second input signal, output a logic high signal to the one or more first processors indicating the predefined voltage on the waveform.

3. The system of claim 1, wherein:
the waveform of the AC voltage signal is at a first frequency;
causing the first readout, by the first camera module, of the first portion of the first image data comprises outputting, by the first camera module, a first shutter signal to trigger the first readout according to at least one of:
a predefined period of time over which the first portion of the first image data is read from the first imaging sensor;
a predefined time delay between identifying the predefined voltage on the waveform by the first camera module and reading out the first portion of the first image data; or
a second frequency according to which the first shutter signal is to be output, wherein the second frequency is different than the first frequency; and
causing the second readout, by the second camera module, of the second portion of the second image data comprises outputting, by the second camera module, a second shutter signal to trigger the second readout according to at least one of:
the predefined period of time over which the second portion of the second image data is read from the second imaging sensor;
the predefined time delay between identifying the predefined voltage on the waveform by the second camera module and reading out the second portion of the second image data; or
the second frequency according to which the second shutter signal is to be output.

4. A method comprising:
monitoring, at a first computing device, a waveform of an alternating current (AC) voltage signal provided by an AC power supply that supplies AC power to the first computing device;

monitoring, at a second computing device, the waveform of the AC voltage signal provided by the AC power supply, wherein the AC power supply supplies AC power to the second computing device;

identifying, at the first computing device, a predefined voltage on the waveform of the AC voltage signal;

identifying, at the second computing device, the predefined voltage on the waveform of the AC voltage signal;

based at least in part on the identifying the predefined voltage at the first computing device, obtaining first image data from a first imaging sensor associated with the first computing device; and based at least in part on the identifying the predefined voltage at the second computing device, obtaining second image data from a second imaging sensor associated with the second computing device.

5. The method of claim 4, wherein the predefined voltage is identified in a first cycle of the waveform of the AC voltage signal, further comprising:

identifying, at the first computing device, the predefined voltage on the waveform during a second cycle of the waveform;

identifying, at the second computing device, the predefined voltage on the waveform during the second cycle of the waveform;

based at least in part on the identifying the predefined voltage during the second cycle, obtaining third image data from the first imaging sensor associated with the first computing device; and based at least in part on the identifying the predefined voltage during the second cycle, obtaining fourth image data from the second imaging sensor associated with the second computing device.

6. The method of claim 4, wherein:

monitoring, at the first computing device, the waveform of the AC voltage signal comprises:

receiving, at a comparator circuit of the first computing device, a first input signal corresponding to a positive portion of the waveform; and receiving, at the comparator circuit, a second input signal corresponding to a negative portion of the waveform; and identifying, at the first computing device, the predefined voltage on the waveform comprises:

detecting, by the comparator circuit, that the first input signal is greater than or equal to the second input signal; and based at least in part on the first input signal being greater than or equal to the second input signal, outputting, from the comparator circuit, an indication of the predefined voltage on the waveform.

7. The method of claim 4, further comprising:

identifying, at the first computing device, the predefined voltage on the waveform according to a first frequency of the waveform;

identifying, at the second computing device, the predefined voltage on the waveform according to the first frequency of the waveform;

based at least in part on identifying the predefined voltage at the first computing device according to the first frequency, obtaining, from the first imaging sensor, third image data according to a second frequency that is different than the first frequency; and based at least in part on identifying the predefined voltage at the second computing device according to the first frequency, obtaining, from the second imaging sensor, fourth image data according to the second frequency.

8. The method of claim 4, wherein:

obtaining the first image data from the first imaging sensor comprises reading the first image data from the first imaging sensor over a predefined period of time; and obtaining the second image data from the second imaging sensor comprises reading the second image data from the second imaging sensor over the predefined period of time.

9. The method of claim 4, wherein:

identifying, at the first computing device, the predefined voltage on the waveform of the AC voltage signal comprises determining that at least one of a negative portion of the waveform transitions to a positive portion of the waveform or the positive portion transitions to the negative portion; and identifying, at the second computing device, the predefined voltage on the waveform of the AC voltage signal comprises determining that the at least one of the negative portion of the waveform transitions to the positive portion of the waveform or the positive portion of the waveform transitions to the negative portion.

10. The method of claim 4, wherein:

obtaining the first image data from the first imaging sensor comprises reading the first image data from the first imaging sensor subsequent to a predefined time delay after identifying, at the first computing device, the predefined voltage on the waveform of the AC voltage signal; and obtaining the second image data from the second imaging sensor comprises reading the second image data from the second imaging sensor subsequent to the predefined time delay after identifying, at the second computing device, the predefined voltage on the waveform of the AC voltage signal.

11. The method of claim 4, wherein the first image data is obtained over a period of time and the second image data is obtained over the period of time, further comprising:

causing, by the first computing device, a first light source to emit light at least partly during the period of time, the first light source being associated with the first imaging sensor; and causing, by the second computing device, a second light source to emit light at least partly during the period of time, the second light source being associated with the second imaging sensor.

12. A system comprising:

a first device comprising:

a first imaging sensor;

one or more first processors; and one or more first computer-readable media storing first computer-executable instructions that, when executed by the one or more first processors, cause the first device to perform first operations comprising:

monitoring a waveform associated with an alternating current (AC) voltage signal provided by a power supply, wherein the AC power supply supplies power to the first device;

identifying a predefined voltage on the waveform of the AC voltage signal;

based at least in part on identifying the predefined voltage, obtaining first image data from the first imaging sensor, at least a portion of the first image data being generated by the first imaging sensor at a particular time; and a second device comprising:
a second imaging sensor;
one or more second processors; and
one or more second computer-readable media storing second computer-executable instructions that, when executed by the one or more second processors, cause the second device to perform second operations comprising:
monitoring the waveform associated with the AC voltage signal provided by the power supply, wherein the power supply supplies power to the second device;
identifying the predefined voltage on the waveform of the AC voltage signal; and
based at least in part on identifying the predefined voltage, obtaining second image data from the second imaging sensor, at least a portion of the second image data being generated by the second imaging sensor at the particular time.

13. The system of claim 12, wherein:
the first operations further comprise, based at least in part on identifying the predefined voltage at the first device, causing a first light source associated with the first imaging sensor to emit light at least at the particular time; and
the second operations further comprise, based at least in part on identifying the predefined voltage at the second device, causing a second light source associated with the second imaging sensor to emit light at least at the particular time.

14. The system of claim 12, wherein:
the predefined voltage is identified at the first device in a first cycle of the waveform of the AC voltage signal;
the first operations further comprising:
identifying, at the first device, the predefined voltage on the waveform during a second cycle of the waveform; and
based at least in part on identifying the predefined voltage during the second cycle at the first deice, obtaining third image data from the first imaging sensor; and
the second operations further comprising:
identifying, at the second device, the predefined voltage on the waveform during the second cycle of the waveform; and
based at least in part on identifying the predefined voltage at the second device during the second cycle, obtaining fourth image data from the second imaging sensor.

15. The system of claim 12, wherein:
the first operations further comprise:
identifying, at the first device, the predefined voltage on the waveform according to a first frequency of the waveform; and
based at least in part on identifying the predefined voltage at the first device according to the first frequency, obtaining, from the first imaging sensor, third image data according to a second frequency that is different than the first frequency; and the second operations further comprise:
identifying, at the second device, the predefined voltage on the waveform according to the first frequency of the waveform; and
based at least in part on identifying the predefined voltage at the second device according to the first frequency, obtaining, from the second imaging sensor, fourth image data according to the second frequency.

16. The system of claim 12, wherein:
identifying, by the first device, the predefined voltage on the waveform of the AC voltage signal comprises determining that at least one of a negative portion of the waveform transitions to a positive portion of the waveform or the positive portion transitions to the negative portion; and
identifying, by the second device, the predefined voltage on the waveform of the AC voltage signal comprises determining that the at least one of the negative portion of the waveform transitions to the positive portion of the waveform or the positive portion of the waveform transitions to the negative portion.

17. The system of claim 12, wherein:
obtaining, at the first device, the first image data from the first imaging sensor comprises reading the first image data from the first imaging sensor subsequent to a predefined time delay after identifying the predefined voltage on the waveform of the AC voltage signal; and
obtaining, at the second device, the second image data from the second imaging sensor comprises reading the second image data from the second imaging sensor subsequent to the predefined time delay after identifying the predefined voltage on the waveform of the AC voltage signal.

18. The system of claim 12, wherein the first device further comprises a comparator circuit configured to:
receive a first input signal corresponding to a positive portion of the waveform;
receive a second input signal corresponding to a negative portion of the waveform; and
based at least in part on the first input signal being greater than or equal to the second input signal, output an indication of the predefined voltage on the waveform.

19. The system of claim 12, wherein:
obtaining, at the first device, the first image data from the first imaging sensor comprises reading the first image data from the first imaging sensor over a predefined period of time; and
obtaining, at the second device, the second image data from the second imaging sensor comprises reading the second image data from the second imaging sensor over the predefined period of time.

20. The system of claim 12, wherein:
the first image data is obtained over a period of time and the second image data is obtained over the period of time;
the first operations further comprise causing a first light source associated with the first imaging sensor to emit light at least partly during the period of time; and
the second operations further comprise causing a second light source associated with the second imaging sensor to emit light at least partly during the period of time.

* * * * *